(12) United States Patent
Nguyen et al.

(10) Patent No.: US 6,856,031 B1
(45) Date of Patent: Feb. 15, 2005

(54) SRAM CELL WITH WELL CONTACTS AND P+ DIFFUSION CROSSING TO GROUND OR N+ DIFFUSION CROSSING TO VDD

(75) Inventors: Phung T. Nguyen, Pleasant Valley, NY (US); Robert C. Wong, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/771,824

(22) Filed: Feb. 3, 2004

(51) Int. Cl.[7] .............................................. H01L 27/11
(52) U.S. Cl. ...................... 257/903; 365/227; 365/154; 438/238; 438/239; 438/386
(58) Field of Search ....................... 257/903; 438/238, 438/239, 386; 365/227, 154

(56) References Cited

U.S. PATENT DOCUMENTS

| | | | |
|---|---|---|---|
| 5,124,774 A | 6/1992 | Godinho et al. | |
| 5,359,226 A | 10/1994 | DeJong | |
| 5,525,923 A | * | 6/1996 | Bialas et al. ................. 327/210 |
| 5,946,566 A | 8/1999 | Choi | |
| 2001/0039089 A1 | 11/2001 | Noble | |
| 2002/0004842 A1 | 2/2002 | Spitzer et al. | |

FOREIGN PATENT DOCUMENTS

JP    93147269    1/1995

* cited by examiner

*Primary Examiner*—Fetsum Abraham
(74) *Attorney, Agent, or Firm*—Scully, Scott, Murphy & Presser; William H. Steinberg, Esq.

(57) ABSTRACT

A low cost SRAM (Static Random Access Memory) cell is disclosed with P well and N well contacts and preferably with a P+ diffusion crossing to ground. The SRAM cell is complete at the M2 metal level and has improved cell passgate leakage, functionality and fabrication yields. The SRAM cell comprises cross coupled pnp pull-up devices P1, P2 and npn pull-down devices N1, N2, with the P1, P2 devices being connected to the power supply VDD, and the N1, N2 devices being coupled through a P+ diffusion region to ground. A first passgate is coupled between a first bitline and the junction of the devices P1 and N1, with its gate coupled to a wordline, and a second passgate is coupled between a second bitline and the junction of devices P2 and N2, with its gate coupled to the wordline.

40 Claims, 3 Drawing Sheets

SRAM CELL WITH WELL CONTACTS AND P+ DIFFUSION CROSSING TO GROUND OR N+ DIFFUSION CROSSING TO VDD

BACKGROUND OF THE INVENTION

1. Field of the Invention

The present invention relates generally to a low cost SRAM (Static Random Access Memory) cell with P and N well contacts and preferably with a P+ diffusion crossing to ground, and more particularly pertains to a low cost design for a SRAM cell that is complete at the M2 metal level and has improved cell passgate leakage, functionality and fabrication yields.

2. Discussion of the Prior Art

Initially, all dimensions shown in FIGS. 1, 2, 4 and 5 are in microns, and FIGS. 1 and 2 also show the dimensions in microns of the SRAM cell size.

FIG. 1 illustrates a top plan view of a circuit lay-out of a prior art 90 nm node technology SRAM cell. FIG. 1 illustrates only the PC (polysilicon conductor) areas, the RX (active silicon conductor regions which are isolated by trench isolation regions) regions, and the M1 (first metal) level of the SRAM cell and chip, and the M2 and M3 (second and third metal) levels are not shown.

FIG. 2 illustrates a simplified version of FIG. 1, and shows only the PC and RX areas and regions of the SRAM cell and chip, and the M1 metal level is not shown.

The prior art 90 nm node technology SRAM cell is fabricated in a base PC (Polysilicon Conductor) level, the overlying bottom M1 metal level, the next higher metal level M2, and the next higher metal layer M3. The prior art 90 nm node technology SRAM cell is fabricated with a PC level wordline WL having a crooked V shape at 10 and an M2 metal level bitline BL. For large SRAM arrays, the PC level is not an efficient enough conductor for the global wordlines, and the M3 metal level must be used for the global wordlines.

In summary, the PC level contains the wordlines WL, the M2 metal level contains the ground GND and the VDD power supply (which are connected through the M1 metal layer, shown in FIG. 1 as M1 GND and M1 VDD, which connect to adjacent SRAM cells) and the bitlines BL, and the M3 metal level contains the global wordlines. The prior art SRAM cell includes 8.5 CA (contacts), 2 V1 (vias), and no PW (P Well) and NW (N Well) contacts which requires that additional real estate be provided on the chip outside the circuit shown in FIG. 1 for periodic contacts to the PWs and NWs.

FIG. 3 illustrates a circuit schematic of the prior art 90 nm node technology SRAM cell. The circuit of the prior art 90 nm node technology SRAM cell is well known and includes cross coupled pnp pull-up devices P1, P2 and npn pull-down devices N1, N2, with the P1, P2 devices being connected to the power supply VDD, and the N1, N2 devices being connected directly to ground GND. The left npn passgate NL is coupled between the left bitline BL and the junction of devices P1 and N1, with its gate coupled to the wordline WL. The right npn passgate NR is coupled between the right bitline BR and the junction of devices P2 and N2, with its gate coupled to the wordline WL.

Referring to FIG. 1 and more clearly to FIG. 2, the PC (Polysilicon Conductor) level WL extends horizontally across the lower portion of the chip with a V shaped dip 10 in the middle, and crosses left and right legs of a bottom M shaped N+RX (active silicon conductor) region, with the crossing on the left defining the passgate NL, with the WL defining the gate G and the RX region defining the source S and drain D regions of the passgate NL, and with the crossing on the right defining the passgate NR, with the WL defining the gate G and the RX region defining the source S and drain D regions of the passgate NR.

Left and right PC regions extend vertically on opposite left and right portions of the SRAM cell as shown in FIGS. 1 and 2.

The top horizontal portion of the bottom M shaped RX region crosses the left PC region and defines the pulldown device N1, with the left PC region defining the gate G and the RX region defining the drain D and source S regions of the pulldown device N1. The top horizontal portion of the M shaped RX region crosses the right PC region and defines the pulldown device N2, with the right PC region defining the gate G and the RX region defining the source S and drain D regions of the pulldown device N2, with a common source region S between the pulldown devices N1 and N2.

A horizontal base of a top W shaped P+RX (active silicon conductor) region crosses the upper portions of the left and right PC regions.

The bottom horizontal portion of the top W shaped RX region crosses the left PC region and defines the pullup device P1, with the left PC region defining the gate G and the RX region defining the drain D and source S regions of the pullup device P1. The bottom horizontal portion of the W shaped RX region crosses the right PC region and defines the pullup device P2, with the right PC region defining the gate G and the RX region defining the source S and drain D regions of the pullup device P2, with a common source region S between the pullup devices P1 and P2.

As illustrated in FIG. 1, the V shape of the PC level word line WL snakes around the GND contact CA 12. The PC level word line WL snaking around the GND contact 12 is the main reason for the M3 metal level global word lines, and for a 45 degree PC level slant over the passgates as shown at 10.

The prior art cell behavior becomes erratic with RX/PC mask/level misalignments.

The passgate leakage of fabricated SRAM cells has also fluctuated from lot to lot and has been excessively high in most cases.

A demand exists for low cost SRAM cells, complete at the M2 metal level, and with better control over cell passgate leakage.

SUMMARY OF THE INVENTION

The present invention provides a low cost SRAM cell with well contacts and preferably a P+ diffusion crossing to ground or alternatively a N+ crossing to VDD, and more particularly provides a low cost design for a SRAM cell that is complete at the M2 metal level and has improved cell passgate leakage, functionality and fabrication yields.

The SRAM cell includes P well and N well contacts and preferably a P+ diffusion crossing to ground. The SRAM cell is complete at the M2 metal level and has improved cell passgate leakage, functionality and fabrication yields. The SRAM cell comprises cross coupled pnp pull-up devices P1, P2 and npn pull-down devices N1, N2, with the P1, P2 devices being connected to the power supply VDD, and the N1, N2 devices being coupled through a P+ diffusion region to ground. A first passgate is coupled between a first bitline and the junction of the devices P1 and N1, with its gate coupled to a wordline, and a second passgate is coupled between a second bitline and the junction of devices P2 and N2, with its gate coupled to the wordline.

BRIEF DESCRIPTION OF THE DRAWINGS

The foregoing objects and advantages of the present invention for a SRAM cell with well contacts and P+ diffusion crossing to ground or N+ diffusion crossing to VDD may be more readily understood by one skilled in the art with reference being had to the following detailed description of several embodiments thereof, taken in conjunction with the accompanying drawings wherein like elements are designated by identical reference numerals throughout the several views, and in which.

DETAILED DESCRIPTION OF THE INVENTION

In the prior art SRAM cell, the PC level word line WL snaking at 10 around the GND contact 12 is the main reason for M3 metal level global word lines, and for the 45 degree PC level slant over the passgates. Moreover, a pseudo anchor 14 of the pulldown NFETs at the PC level is needed to minimize shorting at 16 between the PC level corner and the CA level corner, and because of the pseudo anchor, the PC level word line WL has to be notched down at the edge of the passgate at 18.

Figure 1:
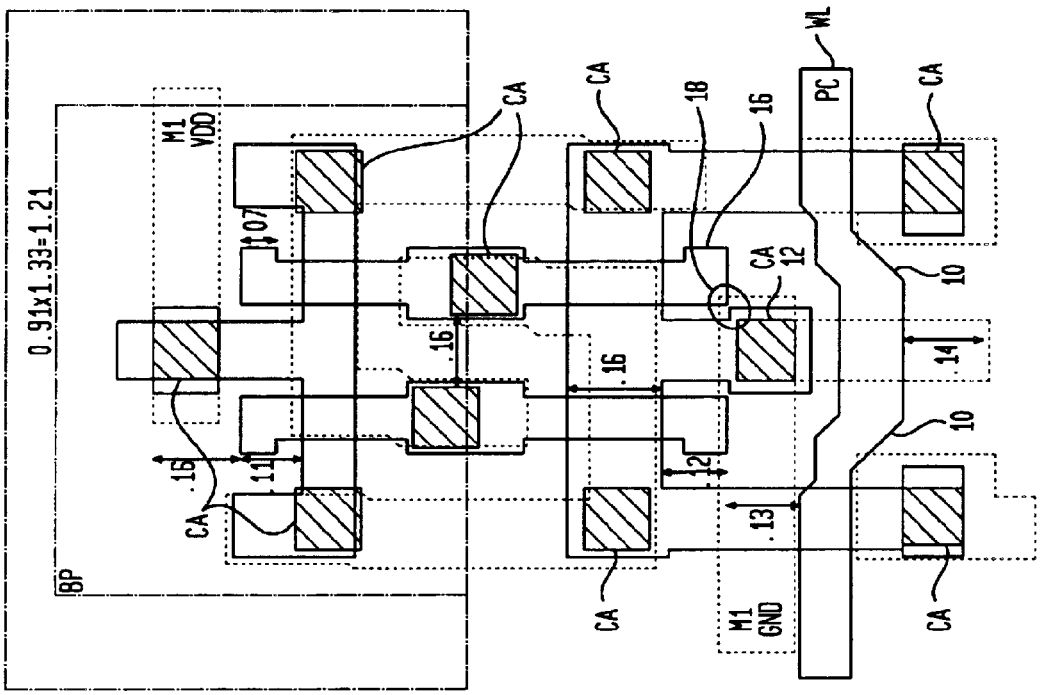
FIG. 1 illustrates a top plan view of a circuit lay-out of a prior art 90 nm node technology SRAM cell and illustrates only the PC (polysilicon conductor) areas, the RX (active silicon conductor region isolated by trench isolation regions) regions, and the M1 level of the SRAM cell, and the M2 and M3 metal levels are not shown.
Figure 4:
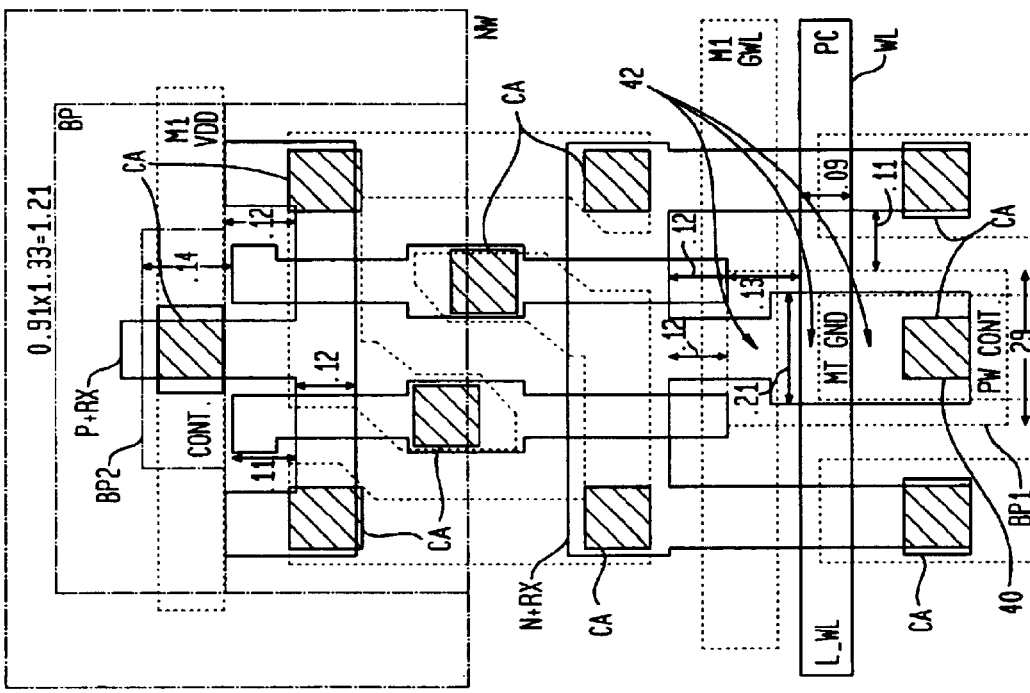
FIG. 4 illustrates a top plan view of a circuit lay out of a preferred embodiment of a SRAM cell of the present invention, and illustrates only the PC areas, the RX regions, and the M1 level of the SRAM cell and chip, and the M2 and M3 metal levels are not shown.
Figure 2:
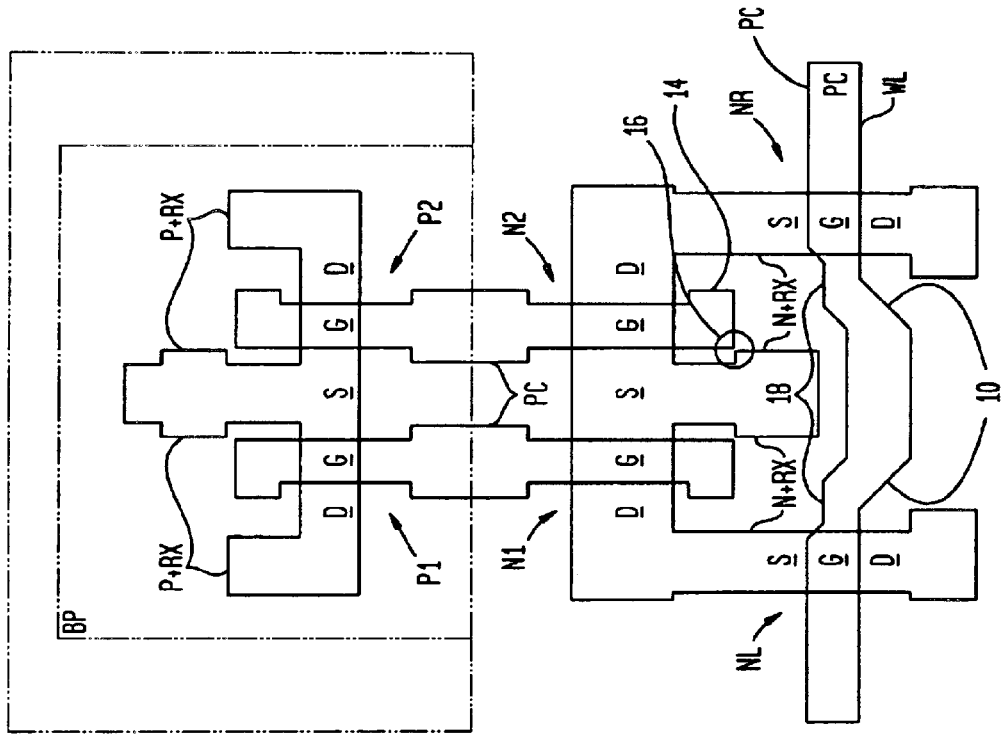
FIG. 2 illustrates a simplified version of FIG. 1, and shows only the PC and RX areas and regions of the SRAM cell, and the M1 metal level is not shown.

In recognition of these problems in the prior art, the present invention shifts the GND contact 40 to the boundary of the cell as shown in FIG. 4. The GND contact for the pulldown NFETs is then connected through a P+ diffusion crossing 42 formed between the P Well and the center leg of a bottom M shaped RX region, as illustrated in FIG. 5.

The present invention provides low cost SRAM cells, complete at the M2 metal level, having improved cell passgate leakage, functionality and fabrication yields, with P and N well contacts and a P+ diffusion crossing to ground.

FIG. 4 illustrates a top plan view of a circuit lay out of a preferred embodiment of a SRAM cell of the present invention, and illustrates only the PC (polysilicon conductor) areas, the RX (active silicon conductor region isolated within trench isolation regions) regions, and the M1 level of the SRAM cell, and the M2 and M3 metal levels are not shown.

Figure 5:
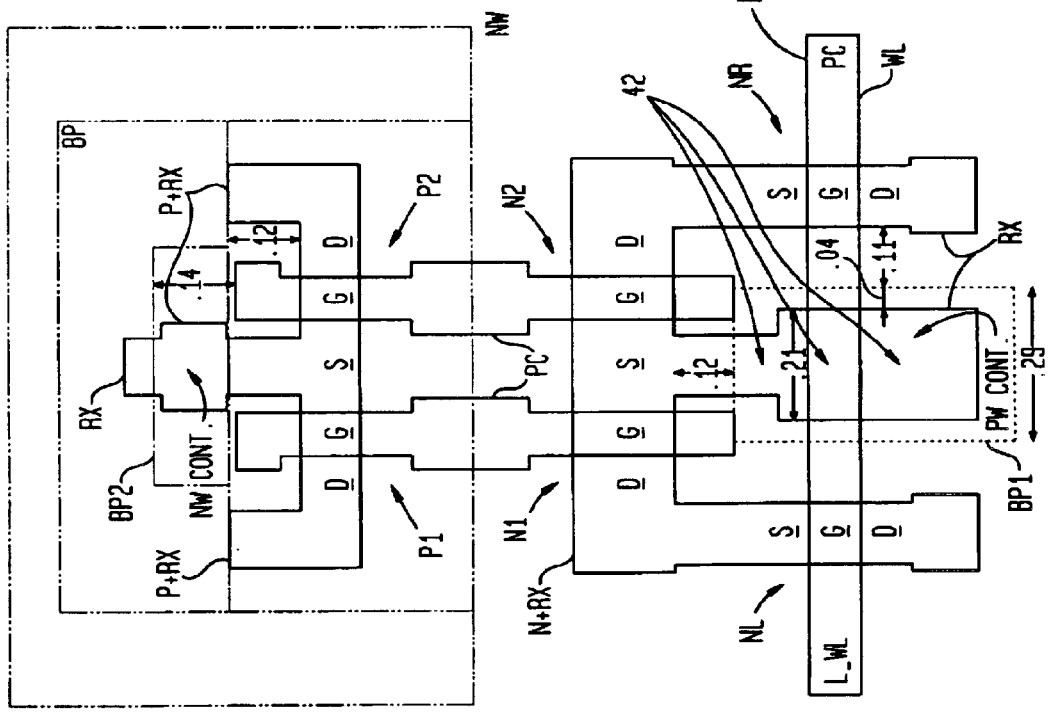
FIG. 5 illustrates a simplified version of FIG. 4, and shows only the PC and RX areas and regions of the SRAM cell and chip, and the M1 metal level is not shown.
Figure 3:
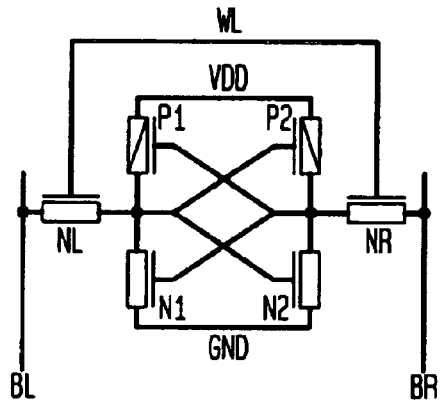
FIG. 3 illustrates a circuit schematic of the prior art 90 nm node technology SRAM cell.

FIG. 5 illustrates a simplified version of FIG. 4, and shows only the PC and RX areas and regions of the SRAM cell, and the M1 metal level is not shown.

FIG. 4 illustrates a top plan view of the lay out of a SRAM cell pursuant to the present invention. The SRAM cell of the present invention has a straight PC level word line WL because of the repositioned GND contact 40, and an M2 metal level bitline BL. The M1 metal level is now used for the global wordlines GWL, as shown by M1 GWL, and also for the power supply VDD, as shown by M1 VDD. In summary, the PC level contains the wordlines WL, the M1 metal level contains the global wordlines GWL and the VDD power supply, and the M2 metal level contains the bitlines BL and the ground GND, and the M3 metal level is not used in the construction of the SRAM cell.

The SRAM cell of the present invention includes 8.0 CA (contacts), less than the 8.5 CA (a 0.5 CA is caused by sharing of a CA) of the prior art, 1.5 V1 (vias), less than the 2.0 V1 of the prior art, and also provides PW and NW contacts.

Figure 6:
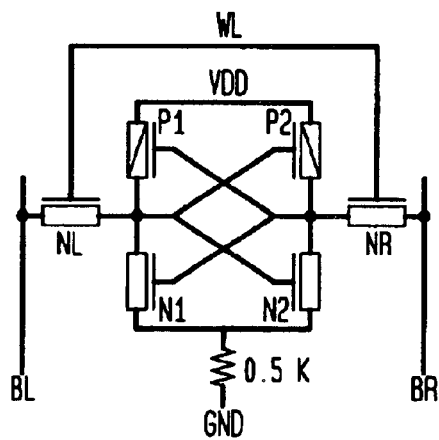
FIG. 6 illustrates a circuit schematic of the SRAM cell of the present invention.

FIG. 6 illustrates a circuit schematic of the SRAM cell of the present invention. Similar to the circuit of the prior art SRAM cell, the circuit includes cross coupled pnp pull-up devices P1, P2, and npn pull-down devices N1, N2, with the P1, P2 devices being connected to the power supply VDD. The N1, N2 devices are coupled through the P+ diffusion region, shown as a 0.5K resistor to ground GND, which is different from the prior art SRAM cell. The left npn passgate NL is coupled between the left bitline BL and the junction of devices P1 and N1, with its gate coupled to the wordline WL. The right npn passgate NR is coupled between the right bitline BR and the junction of devices P2 and N2, with its gate coupled to the wordline WL.

Referring to FIG. 4 and more clearly to FIG. 5, the PC WL extends horizontally straight across the lower portion of the SRAM cell (without a V shaped dip 10 in the middle as in the prior art), and crosses left and right legs of a bottom M shaped N+RX region, with the crossing on the left defining the passgate NL, with the WL defining the gate G and the RX region defining the source S and drain D regions of the passgate WL, and with the crossing on the right defining the passgate NR with the WL defining the gate G and the RX region defining the source S and drain D regions of the passgate WR.

Left and right PC regions extend vertically on opposite left and right portions of the SRAM cell as shown in FIGS. 4 and 5.

The top horizontal portion of the bottom M shaped RX region crosses the left PC region and defines the pulldown device N1, with the left PC region defining the gate G and the RX region defining the drain D and source S regions of the pulldown device N1. The top horizontal portion of the M shaped RX region crosses the right PC region and defines the pulldown device N2, with the right PC region defining the gate G and the RX region defining the source S and drain D regions of the pulldown device N2, with a common source region S between the pulldown devices N1 and N2.

A horizontal base of a top W shaped P+RX region crosses the upper portions of the left and right PC regions.

The bottom horizontal portion of the top W shaped RX region crosses the left PC region and defines the pullup device P1, with the left PC region defining the gate G and the RX region defining the drain D and source S regions of the pullup device P1. The bottom horizontal portion of the W shaped RX region crosses the right PC region and defines the pullup device P2, with the right PC region defining the gate G and the RX region defining the source S and drain D regions of the pullup device P2, with a common source region S between the pullup devices P1 and P2.

FIG. 4 illustrates the position of the PW contact in the lower portion of the cell, and also illustrates the position of the NW contact added around the VDD supply in the upper portion of the cell. FIGS. 4 and 5 illustrate the position of a lower dotted mask BP1 which is used to form a P+ diffusion into the active silicon of the RX region. The P Well contact, shown as PW CONT, is formed in the overlap area/region of the center leg of the bottom M shaped RX region over the P+ diffusion within the area of the dotted mask BP1. FIGS. 4 and 5 also illustrate the position of an upper dotted mask BP2 which is used to form an N+ diffusion into the active silicon of the RX region, and the N Well contact, shown as NW CONT, is formed in the overlap area/region of the center leg of the upper W shaped RX region over the N+ diffusion within the area of the dotted mask BP2.

The overall benefits of the present invention are as follows:

| Invention | Prior Art | Benefits |
|---|---|---|
| straight local PC local WL | crooked PC local WL | no overlay concerns no uncontrollable leakages or malfunctions |
| horizontal M1 for global word line | no free M1 channel | low cost design doesn't need M3 no concern of PC word line drop |
| M1 VDD, M2 GND & BL | M2 VDD & GND, M2 BL | more sturdy GND bus |
| 8 CA, 1.5 V1 built-in well contacts | 8.5 CA, 2V1 well contacts outside cell | better yield smaller array layout less well leakage, smaller chance of latchup |

The cost of these benefits is the extra resistance of the P+ diffusion to GND contact, which is about 500 ohms for this particular layout, and is formed at the intersection of the PC word line and the P+ diffusion runner reaching to the GND contact.

It is like a PFET over PW instead of over NW.

Read access from WL switching up to BL difference of 200 mv degrades by ~5% to 0.6 ns from 0.57 ns, which is negligible for 90 nm node technology circuit designs which have a typical cycle time ranging from 2 ns to 10 ns. Moreover, any degradation in read access is compensated for by a similar amount of improvement in write time.

Noise margins are tabulated below. Again, there is slight degradation, but the delta would be less than the accuracy of simulations.

|  | half-select Invention | half-select Prior Art | standby Invention | standby Prior Art |
|---|---|---|---|---|
| Inm0 (ua) | 41.1 | 41.2 | 79.7 | 84.3 |
| Inm1 (ua) | 11.0 | 11.5 | 27.8 | 27.9 |
| Vnm0 (mv) | 339 | 351 | 447 | 439 |
| Vnm1 (mv) | 624 | 634 | 754 | 761 |

This ground resistance can be eliminated with a P+ channel implant at the crossing of the P+ diffusion and the PC.

Figure 7:
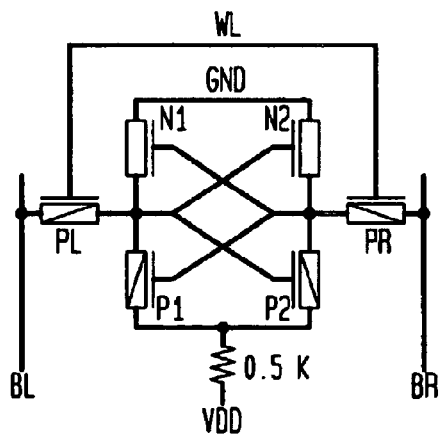
FIG. 7 is a schematic diagram of an alternative embodiment of a PFET passgate cell which is similar in concept to the schematic diagram of FIG. 6, but wherein all N devices are changed to P devices, all P devices are changed to N devices, and VDD and GND have been reversed.

A similar concept can be implemented in an alternative embodiment of a PFET passgate cell, in which case, the crossing would be with N+ diffusion to VDD. FIG. 7 is a schematic diagram of a PFET passgate cell which is similar in concept to the schematic diagram of FIG. 5, but wherein all N devices are changed to P devices, all P devices are changed to N devices, and VDD and GND have been reversed.

While several embodiments and variations of the present invention for an SRAM cell with well contacts and P+ diffusion crossing to ground or N+ diffusion crossing to VDD are described in detail herein, it should be apparent that the disclosure and teachings of the present invention will suggest many alternative designs to those skilled in the art.

Having thus described our invention, what we claim as new and desire to secure by Letters Patent is:

1. A SRAM cell comprising:
    cross coupled pnp pull-up devices P1, P2, and npn pull-down devices N1, N2, with the P1, P2 devices being connected to a power supply VDD;
    a first passgate coupled between a first bitline and the junction of devices P1 and N1, with its gate coupled to a wordline;
    a second passgate coupled between a second bitline and the junction of devices P2 and N2, with its gate coupled to the wordline; and
    wherein the N1, N2 devices are coupled through a P+ diffusion region to a ground.

2. The SRAM cell of claim 1, wherein the N1, N2 devices are coupled through a P+ diffusion region to ground at the intersection of the wordline and a P+ diffusion runner.

3. The SRAM cell of claim 1, fabricated on a chip entirely within a PC (polysilicon conductor) level, an M1 (first metal) level, and an M2 (second metal) level of a chip.

4. The SRAM cell of claim 3, fabricated with a straight PC level word line and a ground contact positioned at a peripheral boundary of the SRAM cell.

5. The SRAM cell of claim 3, fabricated with the M1 level containing global word lines and a power supply VDD, and the M2 level containing the bitlines and ground.

6. The SRAM cell of claim 1, fabricated with a P Well contact and an N Well contact.

7. The SRAM cell of claim 1, wherein the first and second passgates are npn devices.

8. The SRAM cell of claim 1, wherein a PC (polysilicon conductor) level wordline extends straight across a chip and crosses left and right legs of an M shaped RX (active silicon region isolated by trench isolation regions) region, with the crossing on the left defining the first passgate, with the wordline defining the gate and the RX region defining the source and drain regions of the first passgate, and with the crossing on the right defining the second passgate, with the wordline defining the gate and the RX region defining the source and drain regions of the second passgate.

9. The SRAM cell of claim 8, wherein left and right PC regions extend vertically on opposite left and right portions of the chip, a top horizontal portion of the M shaped RX region crosses the left PC region and defines the pulldown device N1, with the left PC region defining the gate and the RX region defining the drain and source regions of the pulldown device N1, the top horizontal portion of the M shaped RX region crosses the right PC region and defines the pulldown device N2, with the right PC region defining the gate and the RX region defining the source and drain regions of the pulldown device N2, with a common source region between the pulldown devices N1 and N2.

10. The SRAM cell of claim 9, wherein a horizontal base of a W shaped RX region crosses upper portions of the left and right PC regions, a bottom horizontal portion of the W shaped RX region crosses the left PC region and defines the pullup device P1, with the left PC region defining the gate and the RX region defining the drain and source regions of the pullup device P1, the bottom horizontal portion of the W shaped RX region crosses the right PC region and defines the pullup device P2, with the right PC region defining the gate and the RX region defining the source and drain regions of the pullup device P2, with a common source region between the pullup devices P1 and P2.

11. A method of fabricating a SRAM cell comprising:
cross coupling pnp pull-up devices P1, P2, and npn pull-down devices N1, N2, with the P1, P2 devices being connected to a power supply VDD;
coupling a first passgate between a first bitline and the junction of devices P1 and N1, and coupling its gate to a wordline;
coupling a second passgate between a second bitline and the junction of devices P2 and N2, and coupling its gate to the wordline; and
coupling the N1, N2 devices through a P+ diffusion region to a ground.

12. The method of claim 11, including coupling the N1, N2 devices through a P+ diffusion region to ground at the intersection of the wordline and a P+ diffusion runner.

13. The method of claim 11, including fabricating the SRAM cell on a chip entirely within a PC (polysilicon conductor) level, an M1 (first metal) level, and an M2 (second metal) level of a chip.

14. The method of claim 13, including fabricating the SRAM cell with a straight PC level word line and a ground contact positioned at a peripheral boundary of the SRAM cell.

15. The method of claim 13, including fabricating the SRAM cell with the M1 level containing global word lines and a power supply VDD, and the M2 level containing the bitlines and ground.

16. The method of claim 11, including fabricating the SRAM cell with a P Well contact and an N Well contact.

17. The method of claim 11, including fabricating the first and second passgates as npn devices.

18. The method of claim 11, including fabricating a PC (polysilicon conductor) level wordline extending straight across a chip and crossing left and right legs of an M shaped RX (active silicon region isolated by trench isolation regions) region, with the crossing on the left defining the first passgate, with the wordline defining the gate and the RX region defining the source and drain regions of the first passgate, and with the crossing on the right defining the second passgate, with the wordline defining the gate and the RX region defining the source and drain regions of the second passgate.

19. The method of claim 18, including fabricating left and right PC regions extending vertically on opposite left and right portions of the chip, a top horizontal portion of the M shaped RX region crossing the left PC region and defining the pulldown device N1, with the left PC region defining the gate and the RX region defining the drain and source regions of the pulldown device N1, the top horizontal portion of the M shaped RX region crossing the right PC region and defining the pulldown device N2, with the right PC region defining the gate and the RX region defining the source and drain regions of the pulldown device N2, with a common source region between the pulldown devices N1 and N2.

20. The method of claim 19, including fabricating a horizontal base of a W shaped RX region crossing upper portions of the left and right PC regions, a bottom horizontal portion of the W shaped RX region crossing the left PC region and defining the pullup device P1, with the left PC region defining the gate and the RX region defining the drain and source regions of the pullup device P1, the bottom horizontal portion of the W shaped RX region crossing the right PC region and defining the pullup device P2, with the right PC region defining the gate and the RX region defining the source and drain regions of the pullup device P2, with a common source region between the pullup devices P1 and P2.

21. A SRAM cell comprising:
cross coupled pnp pull-up devices P1, P2, and npn pull-down devices N1, N2, with the N1, N2 devices being connected to a ground;
a first passgate coupled between a first bitline and the junction of devices P1 and N1, with its gate coupled to a wordline;
a second passgate coupled between a second bitline and the junction of devices P2 and N2, with its gate coupled to the wordline; and
wherein the P1, P2 devices are coupled through a N+ diffusion region to a power supply VDD.

22. The SRAM cell of claim 21, wherein the P1, P2 devices are coupled through a N+ diffusion region to the power supply VDD at the intersection of the wordline and a N+ diffusion runner.

23. The SRAM cell of claim 21, fabricated on a chip entirely within a PC (polysilicon conductor) level, an M1 (first metal) level, and an M2 (second metal) level of a chip.

24. The SRAM cell of claim 23, fabricated with a straight PC level word line and a ground contact positioned at a peripheral boundary of the SRAM cell.

25. The SRAM cell of claim 23, fabricated with the M1 level containing global word lines and a power supply VDD, and the M2 level containing the bitlines and ground.

26. The SRAM cell of claim 21, fabricated with a P Well contact and an N Well contact.

27. The SRAM cell of claim 21, wherein the first and second passgates are pnp devices.

28. The SRAM cell of claim 21, wherein a PC (polysilicon conductor) level wordline extends straight across a chip and crosses left and right legs of an M shaped RX (active silicon region isolated by trench isolation regions) region, with the crossing on the left defining the first passgate, with the wordline defining the gate and the RX region defining the source and drain regions of the first passgate, and with the crossing on the right defining the second passgate, with the wordline defining the gate and the RX region defining the source and drain regions of the second passgate.

29. The SRAM cell of claim 28, wherein left and right PC regions extend vertically on opposite left and right portions of the chip, a top horizontal portion of the M shaped RX region crosses the left PC region and defines the pulldown device N1, with the left PC region defining the gate and the RX region defining the drain and source regions of the pulldown device N1, the top horizontal portion of the M shaped RX region crosses the right PC region and defines the pulldown device N2, with the right PC region defining the gate and the RX region defining the source and drain regions of the pulldown device N2, with a common source region between the pulldown devices N1 and N2.

30. The SRAM cell of claim 29, wherein a horizontal base of a W shaped RX region crosses upper portions of the left and right PC regions, a bottom horizontal portion of the W shaped RX region crosses the left PC region and defines the pullup device P1, with the left PC region defining the gate and the RX region defining the drain and source regions of the pullup device P1, the bottom horizontal portion of the W shaped RX region crosses the right PC region and defines the pullup device P2, with the right PC region defining the gate and the RX region defining the source and drain regions of the pullup device P2, with a common source region between the pullup devices P1 and P2.

31. A method of fabricating a SRAM cell comprising:

cross coupling pnp pull-up devices P1, P2, and npn pull-down devices N1, N2, with the P1, P2 devices being connected to the power supply VDD;

coupling a first passgate between a first bitline and the junction of devices P1 and N1, and coupling its gate to a wordline;

coupling a second passgate between a second bitline and the junction of devices P2 and N2, and coupling its gate to the wordline; and coupling the P1, P2 devices through a N+ diffusion region to a power supply VDD.

32. The method of claim 31, including coupling the P1, P2 devices through a N+ diffusion region to the power supply VDD at the intersection of the wordline and a N+ diffusion runner.

33. The method of claim 31, including fabricating the SRAM cell on a chip entirely within a PC (polysilicon conductor) level, an M1 (first metal) level, and an M2 (second metal) level of a chip.

34. The method of claim 33, including fabricating the SRAM cell with a straight PC level word line and a ground contact positioned at a peripheral boundary of the SRAM cell.

35. The method of claim 33, including fabricating the SRAM cell with the M1 level containing global word lines and a power supply VDD, and the M2 level containing the bitlines and ground.

36. The method of claim 31, including fabricating the SRAM cell with a P Well contact and an N Well contact.

37. The method of claim 31, including fabricating the first and second passgates as npn devices.

38. The method of claim 31, including fabricating a PC (polysilicon conductor) level wordline extending straight across a chip and crossing left and right legs of an M shaped RX (active silicon region isolated by trench isolation regions) region, with the crossing on the left defining the first passgate, with the wordline defining the gate and the RX region defining the source and drain regions of the first passgate, and with the crossing on the right defining the second passgate, with the wordline defining the gate and the RX region defining the source and drain regions of the second passgate.

39. The method of claim 38, including fabricating left and right PC regions extending vertically on opposite left and right portions of the chip, a top horizontal portion of the M shaped RX region crossing the left PC region and defining the pulldown device N1, with the left PC region defining the gate and the RX region defining the drain and source regions of the pulldown device N1, the top horizontal portion of the M shaped RX region crossing the right PC region and defining the pulldown device N2, with the right PC region defining the gate and the RX region defining the source and drain regions of the pulldown device N2, with a common source region between the pulldown devices N1 and N2.

40. The method of claim 39, including fabricating a horizontal base of a W shaped RX region crossing upper portions of the left and right PC regions, a bottom horizontal portion of the W shaped RX region crossing the left PC region and defining the pullup device P1, with the left PC region defining the gate and the RX region defining the drain and source regions of the pullup device P1, the bottom horizontal portion of the W shaped RX region crossing the right PC region and defining the pullup device P2, with the right PC region defining the gate and the RX region defining the source and drain regions of the pullup device P2, with a common source region between the pullup devices P1 and P2.

* * * * *